United States Patent
Williamson et al.

(10) Patent No.: US 10,147,638 B1
(45) Date of Patent: Dec. 4, 2018

(54) METHODS OF FORMING STAIRCASE STRUCTURES

(71) Applicant: Micron Technology, Inc., Boise, ID (US)

(72) Inventors: Lance Williamson, Boise, ID (US); Adam L. Olson, Boise, ID (US); Kaveri Jain, Boise, ID (US); Robert Dembi, Boise, ID (US); William R. Brown, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/858,072

(22) Filed: Dec. 29, 2017

(51) Int. Cl.
| | |
|---|---|
| *H01L 23/48* | (2006.01) |
| *H01L 21/768* | (2006.01) |
| *H01L 23/522* | (2006.01) |
| *H01L 23/528* | (2006.01) |
| H01L 27/11582 | (2017.01) |
| H01L 27/11556 | (2017.01) |

(52) U.S. Cl.
CPC .. *H01L 21/76816* (2013.01); *H01L 21/76877* (2013.01); *H01L 23/5226* (2013.01); *H01L 23/5283* (2013.01); H01L 27/11556 (2013.01); H01L 27/11582 (2013.01)

(58) Field of Classification Search
CPC ......... H01L 21/76816; H01L 21/76877; H01L 23/5226; H01L 23/5283; H01L 27/11556; H01L 27/11582
USPC ....................................................... 257/758
See application file for complete search history.

(56) References Cited

U.S. PATENT DOCUMENTS

| | | |
|---|---|---|
| 2011/0003469 A1 | 1/2011 | Kewley et al. |
| 2011/0129991 A1 | 6/2011 | Armstrong et al. |
| 2011/0169071 A1* | 7/2011 | Uenaka ................ H01L 27/105 257/326 |
| 2013/0295335 A1 | 11/2013 | Sipani et al. |
| 2014/0273462 A1* | 9/2014 | Simsek-Ege ...... H01L 27/11578 438/696 |
| 2015/0325587 A1 | 11/2015 | Chen |

OTHER PUBLICATIONS

Fang et al., U.S. Appl. No. 15/685,690, filed Aug. 24, 2017, titled Semiconductor Device Tructures Comprising Carbon-Doped Silicon Nitride and Related Methods.

* cited by examiner

*Primary Examiner* — Elias M Ullah
(74) *Attorney, Agent, or Firm* — TraskBritt (57) ABSTRACT

Methods of forming staircase structures. The method comprises forming a patterned hardmask over tiers. An exposed portion of an uppermost tier is removed to form an uppermost stair. A first liner material is formed over the patterned hardmask and the uppermost tier, and a portion of the first liner material is removed to form a first liner and expose an underlying tier. An exposed portion of the underlying tier is removed to form an underlying stair in the underlying tier. A second liner material is formed over the patterned hardmask, the first liner, and the second liner. A portion of the second liner material is removed to form a second liner and expose another underlying tier. An exposed portion of the another underlying tier is removed to form another underlying stair. The patterned hardmask is removed. Staircase structures and semiconductor device structure are also disclosed.

28 Claims, 6 Drawing Sheets

METHODS OF FORMING STAIRCASE STRUCTURES

TECHNICAL FIELD

Embodiments disclosed herein relate to semiconductor fabrication including methods of forming staircase structures of semiconductor device structures. More particularly, embodiments of the disclosure relate to methods of forming the staircase structures having improved edge placement of stairs of the staircase structures, improved landing placement uniformity of the stairs, and improved control of forming the stairs and to related staircase structures and semiconductor device structures.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to implement vertical memory array (also referred to as a "three-dimensional (3D) memory array") architectures. A conventional vertical memory array includes transistor/memory-cell pillars extending through openings in repeating conductive structures/insulative structures (e.g., tiers), where the conductive structures function as control gates. The vertically stacked tiers of conductive structures (e.g., word line plates, control gate plates) and insulative structures at each junction of the semiconductor pillars and the conductive structures. Such a configuration permits a greater number of transistors to be located in a unit of die area by building the array upward (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming a so-called "staircase" structure having a series of so-called "stairs" at laterally offset edges (e.g., lateral ends) of the tiers of conductive structures. The individual stairs define contact regions of the conductive structures upon which contact structures can be positioned to provide electrical access to the conductive structures. Various processes of forming staircase structures have been developed, including repeatedly trimming a photoresist material and etching exposed regions of the conductive structures through the trimmed photoresist material to form the stairs at lateral ends of the tiers. This process is referred to herein as a trim-etch-trim process. The trim-etch-trim process creates multiple stair-like steps in the alternating conductive structures and insulating structures, which results in the staircase structure. A stepped profile is formed by patterning the lateral ends, such as peripheral edges, of the tiers. The trim-etch-trim process requires the photoresist material to be deposited at a sufficient thickness to survive the multiple trim acts and etch acts that are conducted. As the number of stairs in a staircase structure increases, the thickness of the photoresist material is increased accordingly to provide sufficient margin for the multiple trim acts and etch acts. However, the increased thickness of the photoresist material increases locational and dimensional error associated with the formation of the stairs. The increased thickness of the photoresist material also leads to problems with edge placement and line width roughness (LWR) of the conductive structures/insulative structures.

To provide electrical connections to both shallow conductive structures and deep conductive structures, openings having different depths are formed through the conductive structures and insulative structures. Since the conductive structures are located at different depths, the openings are formed at various depths to contact (e.g., land on) the individual stairs. To ensure that the openings are formed to the desired depths, an etch process is conducted to form the openings down to the deep conductive structures. However, the amount of time and other conditions of the etch process increase the likelihood that the openings to the shallow conductive structures will be overetched (e.g., punched through) into the underlying conductive structures. Contact structures subsequently formed in such openings land unreliably on the conductive structures, which causes failure of a device including the staircase structure.

BRIEF DESCRIPTION OF THE DRAWINGS

The drawings may use like reference numerals to identify the elements. A letter after a reference numeral, such as "10a," indicates that the text refers specifically to the element having that particular reference numeral. A reference numeral in the text without a following letter, such as "10," may refer to any or all of the elements in the drawings bearing that reference numeral (e.g., "10" in the text may refer to reference numerals "10," "10a," and/or "10b" in the drawings).

FIGS. 1-11B are cross-sectional views showing the fabrication process of a staircase structure in accordance with embodiments of the disclosure.

DETAILED DESCRIPTION

Methods of forming a staircase structure are described, as are the resulting staircase structures and semiconductor device structures including the staircase structures. The staircase structures are formed by conducting successive (e.g., repeated, alternating) formation (e.g., deposition) acts and removal (e.g., etch) acts on a stack of alternating conductive structures (e.g., conductive levels) and insulating structures (e.g., insulating levels, dielectric levels) on a substrate. To form the staircase structure, a hardmask is formed over the stack and patterned to form an opening. A width of the opening corresponds to a widest dimension that is ultimately to be formed in the staircase structure. Liner materials are successively formed over the hardmask and in the opening at a thickness that corresponds to a desired tread width of stairs to be formed in the staircase structure. Horizontal portions of the liner materials over the hardmask and within the opening are removed to form vertically extending liners adjacent to the hardmask. The liners are used as masks in an etch process used to form the stairs of the staircase structure. By repeatedly forming the liners and using the liners as masks to form the stairs, the staircase structure exhibits improved edge placement, improved landing placement uniformity, and finer thickness control compared to staircase structures formed by conventional trim-etch-trim processes. The stairs formed by embodiments of the disclosure also exhibit improved line width roughness (LWR) compared to stairs formed by conventional techniques.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure or a complete process flow for manufacturing semiconductor device structures and the structures described below do not form a complete semiconductor device structure. Only those process acts and structures necessary to understand the embodiments described herein are described in detail below. Additional acts to form a complete semiconductor device structure may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the terms "vertical", "longitudinal", "horizontal", and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, and arrangement of one or more of at least one structure and at least one apparatus facilitating operation of one or more of the structure and the apparatus in a pre-determined way.

As used herein, the term "selectively etchable" means and includes a material that has an etch rate that is at least about two times (2×) greater than the etch rate of another material, such as about five times (5×) greater, about ten times (10×) greater, about twenty times (20×) greater, or about forty times (40×) greater relative to the etch rate of the another material.

As used herein, the term "staircase structure" means and includes a semiconductor structure having tiers that exhibit a stepped profile. The tiers include alternating insulative levels (e.g., oxide levels, oxide materials) and nitride materials on a substrate. Alternatively, the tiers include alternating insulative levels (e.g., oxide levels, oxide materials) and conductive levels (e.g., conductive materials) on the substrate. Peripheral regions of the tiers correspond to stairs of the staircase structure and provide the stepped profile of the staircase structure.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor structure may include, but are not limited to, semiconductive materials, insulating materials, conductive materials, etc. One or more of the materials may be thermally sensitive. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein with reference to staircase structure fabrication processes and resulting staircase structures, the term "tier" refers collectively to one insulative level (e.g., oxide level, oxide material) and one nitride material, or collectively to one insulative level (e.g., oxide level, oxide material) and one conductive level (e.g., conductive material).

The tier may include the insulative level over the nitride material, the nitride material over the insulative level, the insulative level over the conductive level, or the conductive level over the insulative level.

As used herein with reference to staircase structure fabrication processes and resulting staircase structures, the term "tread width" means and refers to a horizontal dimension of an individual stair of a staircase structure as measured in a direction toward an opposing side of the staircase structure, and the term "riser height" means and refers to a vertical dimension of an individual stair of a staircase structure.

Figure 1:
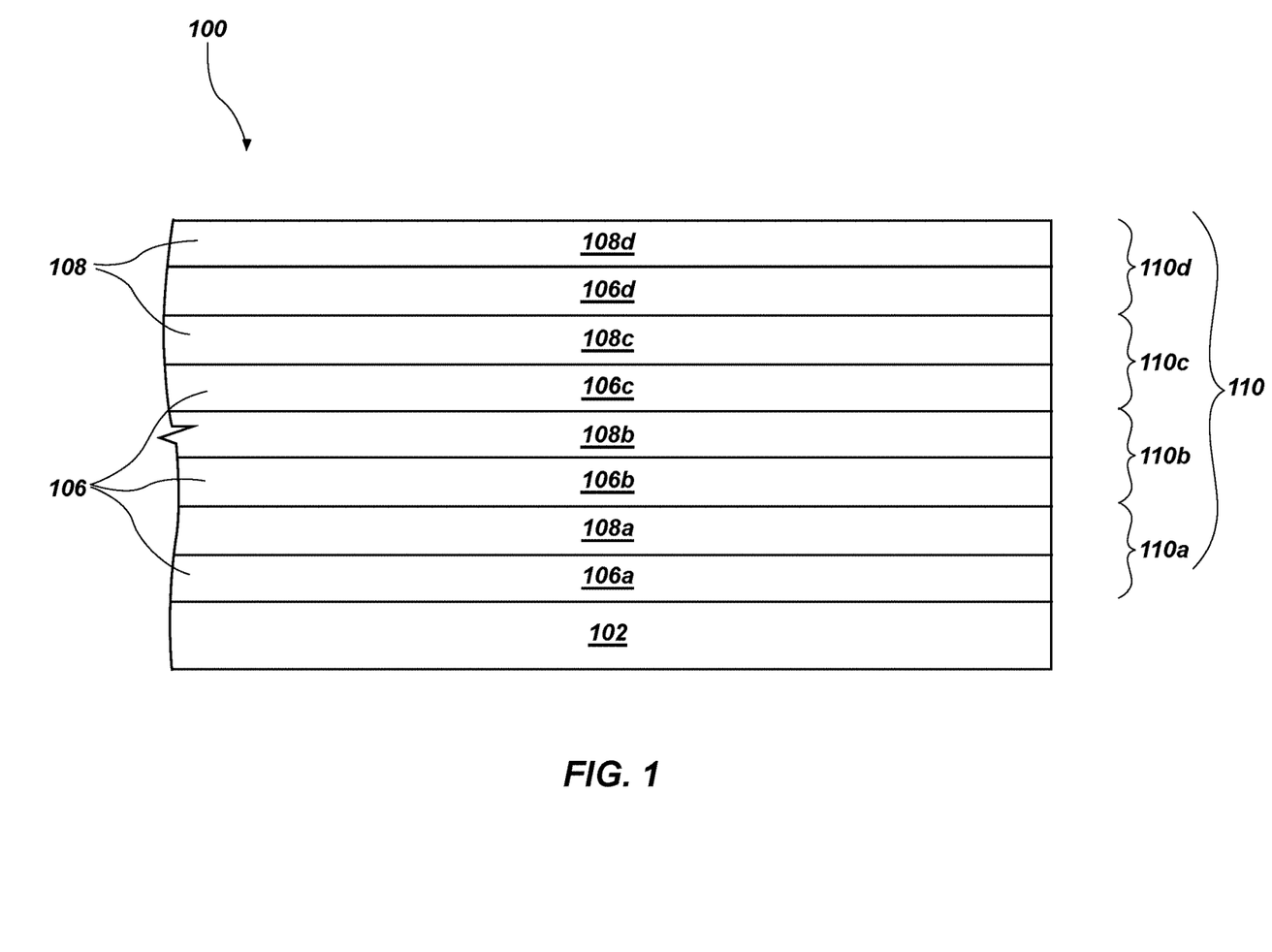

As shown in FIG. 1, a semiconductor structure 100 from which a staircase structure 122, 122' (see FIGS. 10A and 10B) is to be formed includes a substrate 102, and alternating conductive levels 106 and insulative levels 108 arranged in tiers 110 over the substrate 102. The materials of the conductive levels 106 and the insulative levels 108 may be selected such that the conductive levels 106 and the insulative levels 108 are selectively etchable relative to one another. For clarity and ease of understanding of the drawings and related description, FIG. 1 shows four (4) tiers 110a-110d of the conductive levels 106a-106d and the insulative levels 108a-108d. A first tier 110a includes a first conductive level 106a and a first insulative level 108a over the first conductive level 106a; a second tier 110b overlies the first tier 110a, and includes a second conductive level 106b and an insulative level 108b over the second conductive level 106b; a third tier 110c overlies the second tier 110b, and includes a third conductive level 106c and a third insulative level 108c over the third conductive level 106c; and a fourth tier 110d overlies the third tier 110c, and includes a fourth conductive level 106d and a fourth insulative level 108d over the fourth conductive level 106d. However, the semiconductor structure 100 may include a different number of tiers 110. For example, in additional embodiments, the semiconductor structure 100 includes greater than four (4) tiers 110 (e.g., greater than or equal to ten (10) tiers 110, greater than or equal to twenty-five (25) tiers 110, greater than or equal to fifty (50) tiers 110, greater than or equal to one hundred (100) tiers 110, greater than or equal to five hundred (500) tiers 110, or greater than or equal to one thousand (1000) tiers 110) of the conductive level 106 and the insulative level 108, or may include less than four (4) tiers 110 (e.g., three (3) tiers 110 or two (2) tiers 110) of the conductive levels 106 and the insulative levels 108.

The semiconductor structure 100 in FIG. 1 may, alternatively, include nitride materials in place of the conductive levels 106. The nitride materials are replaced with a conductive material at a later stage of processing, in a so-called "replacement gate" process, to form the conductive levels 106. Details of the replacement gate process are known in the art and, therefore, are not described in detail herein.

The conductive levels 106 may be formed of and include at least one conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. In one embodiment, the conductive levels 106 are formed from polysilicon. The conductive levels 106 may, for example, be formed of and include a stack of at least two different conductive materials. The conductive levels 106 may each be substantially planar, and may each independently exhibit any suitable desired thickness. The thickness of each of the conductive levels 106 may range from about 1 nm to about 1000 nm, such as from about 1 nm to about 500 nm, from about 10 nm to about 500 nm, or from about 10 nm to about 250 nm. In one embodiment, the thickness of the conductive levels 106 ranges from about 10 nm to about 100 nm.

Each of the conductive levels 106 may be substantially the same (e.g., exhibit substantially the same material composition, average grain size, material distribution, size, and shape) as one another, or at least one of the conductive levels 106 may be different (e.g., exhibit one or more of a different material composition, a different average grain size, a different material distribution, a different size, and a different shape) than at least one other of the conductive levels 106. As a non-limiting example, each of the first conductive level 106a, the second conductive level 106b, the third conductive level 106c, the fourth conductive level 106d, and the fifth conductive level 106e may exhibit substantially the same material composition, material distribution, and thickness. In some embodiments, each of the conductive levels 106 is substantially the same as each other of the conductive levels 106.

The insulative levels 108 may be formed of and include at least one insulating material, such as an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., silicon nitride), an oxynitride material (e.g., silicon oxynitride), amphorous carbon, or a combination thereof. In one embodiment, the insulative levels 108 are formed from a silicon oxide, such as silicon dioxide. The insulative level 108 may also, for example, be formed of and include a stack (e.g., laminate) of at least two different insulating materials. The insulative levels 108 may each be substantially planar, and may each independently exhibit any desired thickness. The thickness of each of the insulative level 108 may range from about 1 nm to about 1000 nm, such as from about 1 nm to about 500 nm, from about 10 nm to about 500 nm, or from about 10 nm to about 250 nm. In one embodiment, the thickness of the insulative level 108 ranges from about 10 nm to about 100 nm.

Each of the insulative levels 108 may be substantially the same (e.g., exhibit substantially the same material composition, material distribution, size, and shape) as one another, or at least one of the insulative levels 108 may be different (e.g., exhibit one or more of a different material composition, a different material distribution, a different size, and a different shape) than at least one other of the insulative levels 108. As a non-limiting example, each of the first insulative level 108a, the second insulative level 108b, the third insulative level 108c, the fourth insulative level 108d, and the fifth insulative level 108e may exhibit substantially the same material composition, material distribution, and thickness. In some embodiments, each of the insulative levels 108 is substantially the same as each other of the insulative levels 108.

The conductive levels 106 and the insulative levels 108 are arranged in an alternating sequence on the substrate 102 beginning with one of the conductive levels 106. However, the conductive levels 106 and the insulative levels 108 may be arranged in a different sequence, such as beginning with one of the insulative levels 108. Accordingly, each of the tiers 110 may alternatively include one of the conductive levels 106 on or over one of the insulative levels 108. A semiconductor device (e.g., a vertical memory device, such as a 3D NAND Flash memory device; a crosspoint memory device, such as a 3D crosspoint memory device) employing a semiconductor device structure having such a configuration may have little or no difference in terms of functionality or operability as compared to a semiconductor device employing the arrangement of the conductive levels 106 and the insulative levels 108 shown in FIG. 1.

The substrate 102, the conductive levels 106, and the insulative levels 108 may each independently be formed using conventional processes including, but not limited to, physical vapor deposition ("PVD"), chemical vapor deposition ("CVD"), atomic layer deposition ("ALD"), and/or spin-coating. PVD includes, but is not limited to, one or more of sputtering, evaporation, precursor spin-coating/calcination, and ionized PVD. Such processes are known in the art and, therefore, are not described in detail herein.

Figure 2:
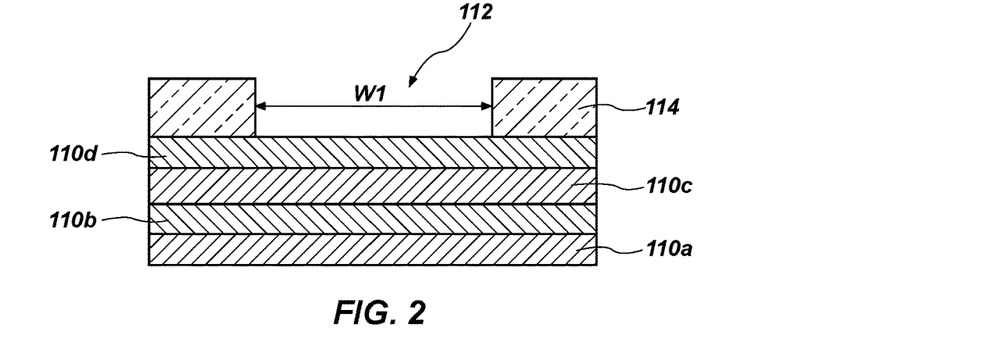

After forming the conductive levels 106 and the insulative levels 108, a hardmask material is formed over the tiers 110 and patterned to form an opening 112 in hardmask 114, as shown in FIG. 2. For simplicity, the substrate 102, the conductive levels 106, and the insulative levels 108 are not individually illustrated in FIGS. 2-11B. The hardmask material is formed over the tiers 110 by conventional techniques. To form the opening 112, a photoresist (not shown) is formed over the hardmask material and patterned by conventional techniques, which pattern is transferred into the hardmask material. The opening 112 in the hardmask 114 is formed by conventional photolithography techniques, which are not described in detail herein. The opening 112 in the hardmask 114 has a width W1, which corresponds to a widest dimension within the staircase structure 122, 122' (see FIGS. 10A and 10B), with subsequently-formed openings 112a-112c in the tiers 110 (see FIGS. 3, 7, 9) having widths that are less than that of the opening 112.

The hardmask 114 may be formed of a material that exhibits good hardness properties, good resistance to etch conditions, and good etch selectivity. The hardmask 114 may be sufficiently resistant to the etch conditions used to form stairs 116 (see FIGS. 3, 7, 9) that a portion of the hardmask 114 remains following the formation of the stairs 116. The hardmask 114 is formed at a sufficient thickness to protect the underlying materials during the formation of the stairs 116. The thickness of the hardmask 114 may be selected depending on the number of stairs 116 to be formed and the material used as the hardmask 114. The hardmask 114 may be selectively etchable relative to the material of the substrate 102 and to the materials of the tiers 110. By way of example only, the hardmask 114 may be a spin-on hardmask material, an organo siloxane material, a carbon-based material, a carbon-silicon material, a nitride material, such as silicon nitride or titanium nitride, a metal material, or a metal oxide material.

Figure 3:
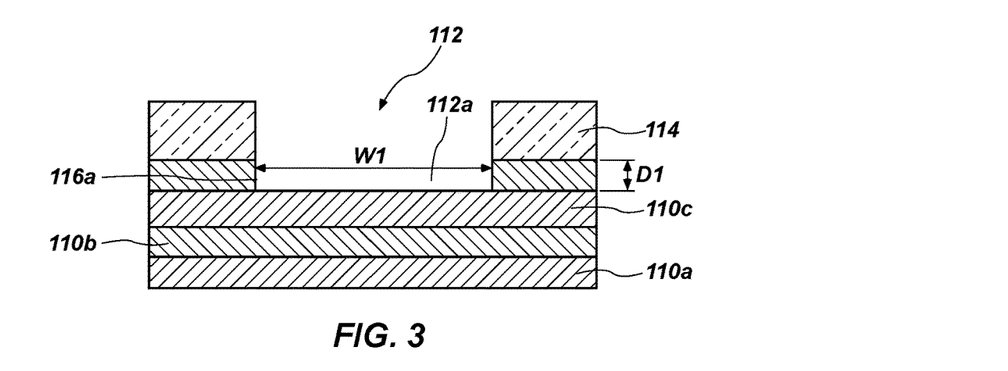

As shown in FIG. 3, a portion of the fourth tier 110d exposed through the opening 112 in the hardmask 114 is removed, transferring the pattern in the hardmask 114 to the fourth tier 110d and forming opening 112a in the fourth tier 110d. The opening 112a has a width of W1 and a depth D1. The depth D1 of the opening 112a in the fourth tier 110d substantially corresponds to a riser height of the stair 116 ultimately to be formed. The opening 112a in the fourth tier 110d may be formed by one or more removal acts. A desired portion of the conductive level 106d and the insulative level 108d of the fourth tier 110d may be removed by separate removal acts or by a single removal act. For instance, the desired portion of the conductive level 106d and the insulative level 108d may be removed by anisotropically etching the materials of the conductive level 106d and the insulative level 108d. By way of example only, the desired portion of the conductive level 106d and the insulative level 108d may be removed by an anisotropic, dry etching act. The etch chemistry and etch conditions to form the opening 112a in the fourth tier 110d may be determined by a person of ordinary skill in the art depending on the materials used for the conductive level 106d and the insulative level 108d. The formation of the opening 112a produces the uppermost stair 116a on each facing side of the staircase structure 122.

Figure 4:
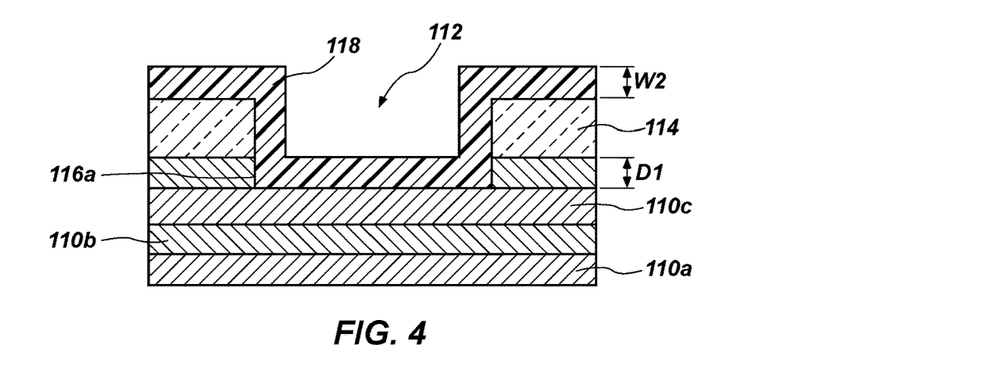

After forming the opening 112a in the fourth tier 110d, a first liner material 118 is formed over the hardmask 114 and over exposed surfaces defined by the opening 112a as shown in FIG. 4. The first liner material 118 may be formed over horizontal surfaces and vertical surfaces of the hardmask 114 and over horizontal surfaces and vertical surfaces of the fourth tier 110d that define the opening 112a. The first liner material 118 may be conformally formed over the hardmask 114 and in the opening 112a at a desired thickness. The first liner material 118 may be formed by ALD, CVD (e.g., plasma-enhanced CVD), a diffusion-based deposition, or other conformal deposition technique. The thickness of the first liner material 118 corresponds to a tread width W2 of the stair 116b to be formed. The first liner material 118 may be formed at a thickness of from about 10 nm to about 1,000 nm, such as from about 10 nm to about 100 nm, from about 20 nm to about 90 nm, from about 30 nm to about 80 nm, from about 40 nm to about 70 nm, or from about 50 nm to about 60 nm.

The first liner material 118 may be formed of a material that is selectively etchable relative to at least one of the materials of the tiers 110, the material of the hardmask 114, and the material of the substrate 102. The first liner material 118 may also exhibit a high degree of conformality and smoothness. The material of the first liner material 118 may, optionally, be selectively etchable relative to materials used to form subsequent liners. By way of example only, the first liner material 118 may be a silicon oxide, a silicon nitride, or a metal oxide, such as aluminum oxide. The first liner material 118 may be commercially available. A dopant, such as boron, phosphorus, arsenic, or aluminum oxide, may be incorporated into the silicon oxide to achieve the desired etch selectivity. Alternatively, the desired etch selectivity may be achieved by using silicon oxides of different qualities or silicon oxides having different crystalline structures.

Figure 5:
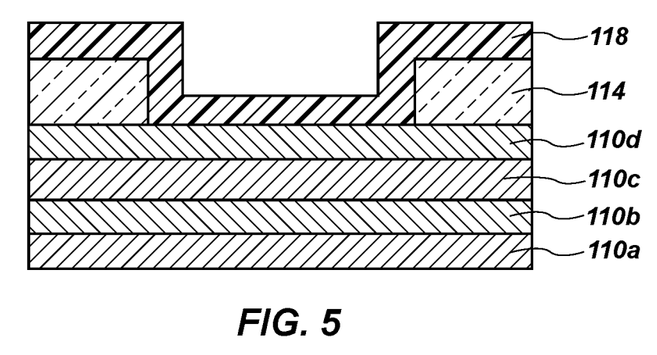
Figure 6:
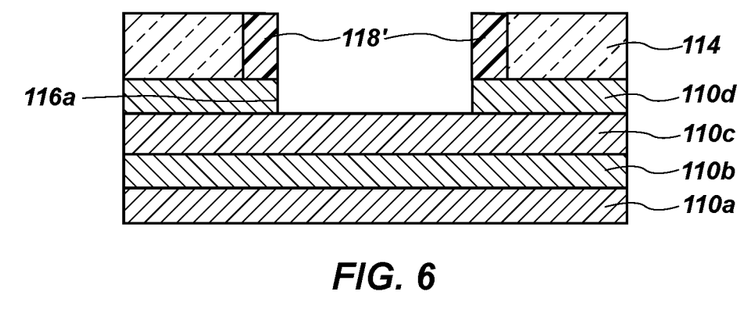

Alternatively, the uppermost stair 116a may be produced by forming the first liner material 118 over the hardmask 114 and over the portion of the fourth tier 110d exposed through the opening 112 in the hardmask 114, as shown in FIG. 5. As shown in FIG. 6, horizontal portions of the first liner material 118 positioned over the hardmask 114 and horizontal portions of the first liner material 118 positioned over the fourth tier 110d may be removed, while vertical portions of the first liner material 118 remain on vertical surfaces of the hardmask 114, forming first liner 118'. By way of example only, the horizontal portions of the first liner material 118 may be removed directionally, such as by a dry etch process. The removal of the first liner material 118 may also remove a portion of the hardmask 114, forming the uppermost stair 116a in the fourth tier 110d. The first liner 118' is positioned on sidewalls of the hardmask 114 as well as over a portion of a horizontal surface of the third tier 110c. The first liner 118' is laterally adjacent to the hardmask 114. The hardmask 114 and first liner 118' are used as a mask to form the stair 116b in a manner similar to that described below. Subsequent liner materials are formed similar to that described below and used to form additional stairs in a manner similar to that described below.

Figure 7:
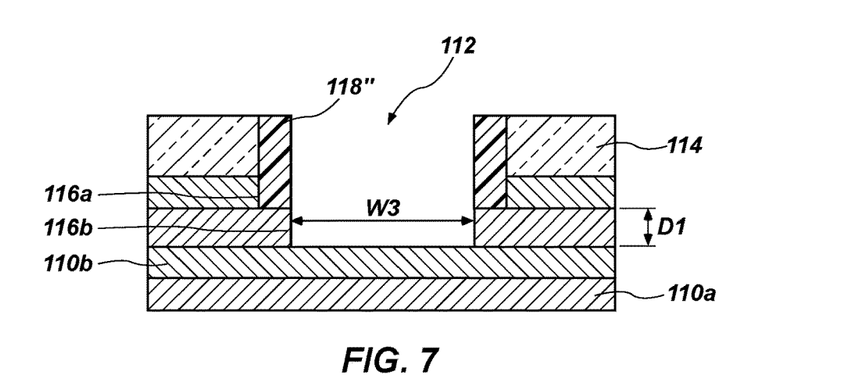

Portions of the first liner material 118 are removed to form first liner 118", as shown in FIG. 7. Horizontal portions of the first liner material 118 positioned over the hardmask 114 and horizontal portions of the first liner material 118 positioned adjacent to the fourth tier 110d may be removed, while vertical portions of the first liner material 118 remain on vertical surfaces of the hardmask 114 and the fourth tier 110d. By way of example only, the horizontal portions of the first liner material 118 may be removed directionally, such as by a dry etch process. The removal of the first liner material 118 may also remove a portion of the hardmask 114. The desired portions of the first liner material 118 may be removed by appropriately selecting the etch conditions, such as the etch chemistry, etch time, and etch power. The etch chemistry may be selected depending on the material used as the first liner material 118 and the material used as the hardmask 114. The first liner 118" is positioned on sidewalls of the hardmask 114 and on sidewalls of the fourth tier 110d, as well as over a portion of a horizontal surface of the third tier 110c. The first liner 118" is laterally adjacent to the hardmask 114 and the fourth tier 110d. An upper surface of the first liner 118" is coplanar with an upper surface of the hardmask 114 and a lower surface of the first liner 118" is coplanar with a lower surface of the fourth tier 110d. The thickness of the first liner 118" corresponds to a width W2 of the stair 116b to be formed.

Figure 9:
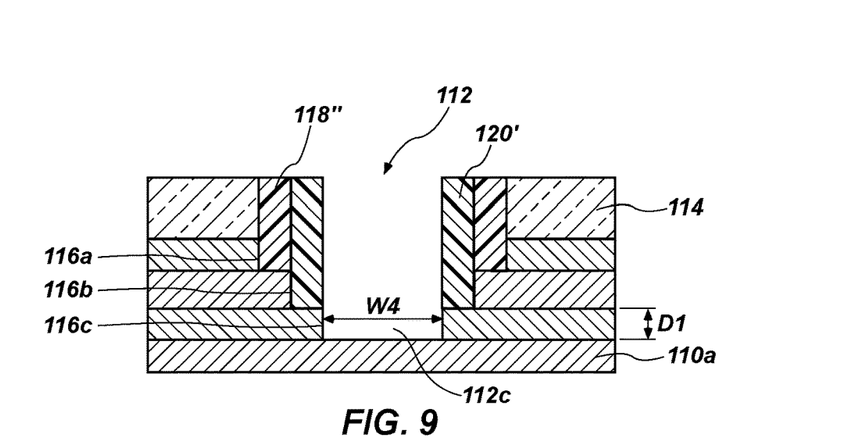

As shown in FIG. 9, the hardmask 114 and first liner 118" are used as a mask to form the stair 116b by removing an exposed portion of the third tier 110c. The exposed portion of the third tier 110c is the portion of the third tier 110c not covered by the hardmask 114 and the first liner 118". Removing the exposed portion of the third tier 110c forms opening 112b in the third tier 110c having width W3. The formation of the opening 112b corresponds to the formation of a deeper (i.e., less shallow) stair 116b of the staircase structure 122. The width W3 of the opening 112b in the third tier 110c is less than the width W1 of the opening 112a in the fourth tier 110d by two times the thickness W2 of the first liner 118". The depth D1 of the opening 112b in the third tier 110c substantially corresponds to a height of the stair 116b. The opening 112b in the third tier 110c may be formed by one or more removal acts as described above for the third tier 110c. The etch chemistry and etch conditions to form the opening 112b in the third tier 110c may be selected by a person of ordinary skill in the art depending on the materials used for the conductive level 106c and the insulative level 108c.

Figure 8:
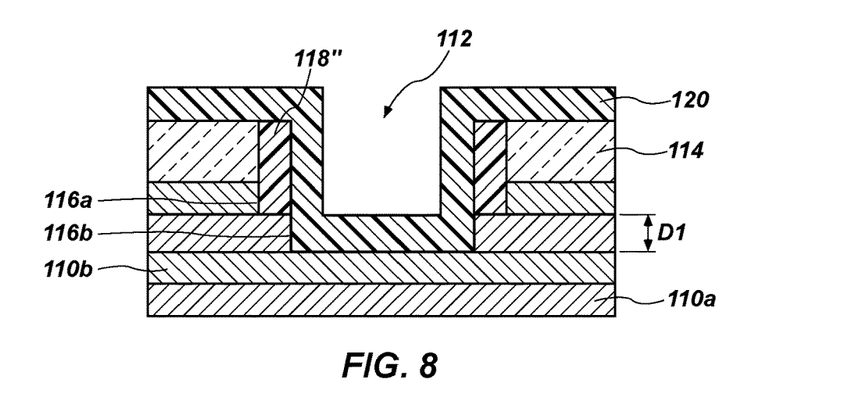

A second liner material 120 may be formed over the hardmask 114, over the first liner 118", and over exposed surfaces defined by the opening 112b in the third tier 110c as shown in FIG. 8. The second liner material 120 may be formed over horizontal surfaces of the hardmask 114, over horizontal and vertical surfaces of the first liner 118", and over horizontal surfaces and vertical surfaces of the third tier 110c that define the opening 112b in the third tier 110c. The second liner material 120 may be conformally formed over the hardmask 114 and in the opening 112b at a desired thickness as described above for the first liner material 118. The thickness of the second liner material 120 corresponds to a tread width W2 of the stair 116c to be formed and is within the range described above for the first liner material 118.

The second liner material 120 may be selectively etchable relative to at least one of the materials of the tiers 110, the first liner material 118, or the materials of subsequently-formed liner materials. The second liner material 120 may be formed of one of the materials described above for the first liner material 118. The first liner material 118 and the second liner material 120 may be formed from the same material or from a different material.

Portions of the second liner material 120 may be removed to form second liner 120', as shown in FIG. 9. Horizontal portion of the second liner material 120 positioned over the hardmask 114 and the first liner 118" and horizontal portions of the second liner material 120 positioned adjacent to the third tier 110c may be removed, while vertical portions of the second liner material 120 remain on vertical surfaces of the first liner 118" and of the third tier 110c. The removal of the second liner material 120 may also remove a portion of the hardmask 114. The second liner 120' is positioned on sidewalls of the first liner 118", on sidewalls of the third tier 110c, and on a portion of a horizontal surface of the second tier 110b. The second liner 120' is laterally adjacent to the first liner 118" and the third tier 110c. An upper surface of the second liner 120' is substantially coplanar with the upper surface of the hardmask 114 and the upper surface of the first liner 118", and a lower surface of the second liner 120' is substantially coplanar with a lower surface of the third tier 110c. The thickness of the second liner 120' corresponds to the tread width W2 of the stair 116c.

As shown in FIG. 9, the hardmask 114, first liner 118", and second liner 120' are used as a mask to form stair 116c by removing an exposed portion of the second tier 110b. The exposed portion of the second tier 110b is the portion of the second tier 110b not covered by the hardmask 114, the first liner 118", and the second liner 120'. Removing the exposed portion of the second tier 110b forms opening 112c in the second tier material 120 having width W4. The formation of the opening 112c corresponds to the formation of an even deeper (i.e., even less shallow) stair 116c of the staircase structure 122. The width W4 of the opening 112c in the second tier 110b is less than the width W1 of the opening 112a in the fourth tier 110d by two times the width W2 of the first liner 118" and the two times the thickness W3 of the second liner 120'. The depth D1 of the opening 112c in the second tier 110b substantially corresponds to a riser height of the stair 116c. The opening 112c in the second tier 110b may be formed by one or more removal acts as described above for the fourth tier 110d.

The first liner 118" and second liner 120', and any subsequently formed liners, may have a length within a range of from about 1 μm to about 15 μm, such as from about 2 μm to about 12 μm, from about 3 μm to about 11 μm, from about 5 μm to about 15 μm, or from about 1 μm to about 10 μm. As described in more detail below, the length of the liners 118", 120' corresponds to the length of contact structures subsequently to be formed.

Figure 10A:
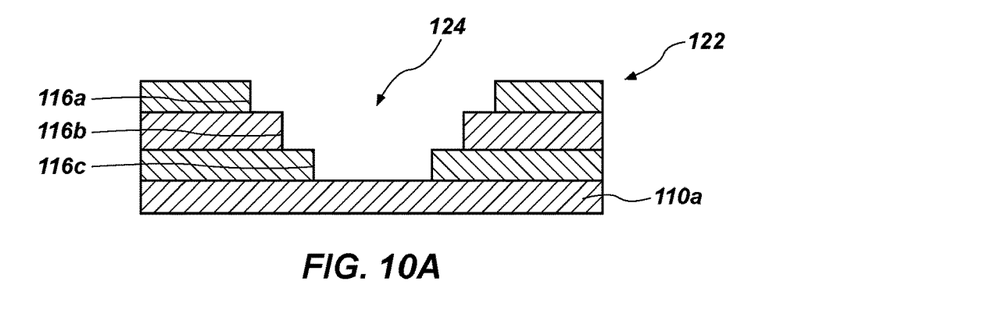

After the deepest stair (e.g., stair 116c of FIG. 9) is formed, the hardmask 114, first liner 118", and second liner 120' may then be removed to form the staircase structure 122. FIG. 10A illustrates the staircase structure 122 having three stairs 116a-116c and a gap 124 (e.g., a valley) between opposing sides of the staircase structure 122 where the first liner 118" and second liner 120' were previously located. In this embodiment, the first and second liners 118", 120' are sacrificial. Each of the stairs 116a-116c has the tread width W2 corresponding to the thickness of the first and second liners 118″, 120′ and the riser height corresponding to the depth D1 of the openings 112a-112c. Since the staircase structure 122 has a stepped profile, the width of the gap 124 may range from W4 at the deepest stair 116c to W1 at the shallowest stair 116a. The hardmask 114, first liner 118′, and second liner 120′ may be removed by one or more etch processes, such as a wet etch process or an anisotropic, dry etch process. The gap 124 is subsequently filled with a dielectric material as described below.

Since the tread width W2 of the stairs 116b, 116c formed by embodiments of the disclosure is determined by the thickness at which the first liner material 118 and the second liner material 120 are formed, the stairs 116b, 116c have a smaller tread width than stairs formed by the conventional trim-etch-trim processes. The tread width of a stair formed by conventional techniques is limited by the resolution of photolithography/etch techniques, while the tread width W2 of the stairs 116b, 116c formed by embodiments of the disclosure is determined by the thickness at which the first liner material 118 and the second liner material 120 is formed. Since deposition of a material is more controllable than etching of the material, the stairs 116b, 116c have improved edge placement and improved uniformity in the stair tread width. Errors in edge placement of the stairs 116b, 116c are dependent on the thickness at which the liners 118′, 120′ are formed. Since the thickness of the liners 118′, 120′ controllable, the errors in edge placement are lower. The smaller tread widths of the stairs 116b, 116c enable the footprint of the staircase structure 122 to be smaller than a footprint of a staircase structure formed by conventional techniques. Additionally, in a staircase structure formed by conventional trim-etch-trim process, errors in edge placement of the stairs are cumulative and increase in the stairs formed more distal to the substrate.

While the stairs 116a-116c are shown in FIG. 10A as being of substantially the same height, the stairs 116a-116c may have different heights by forming the openings 112a, 112b, 112c at different depths. In other words, the depths of each of the openings 112a, 112b, 112c may be different. As also shown in FIG. 10A, the stairs 116a-116c have substantially the same tread width W2. If, however, stairs 116a-116c having different tread widths are desired, the first liner material 118 and the second liner material 120 may be formed to different thicknesses. The stairs 116a-116c may have a graduated tread width, with a smaller tread width of stairs proximal to the substrate 102 and a larger tread width of stairs distal to the substrate 102. By way of example only, the uppermost stair 116a may have a wider tread width than the lowermost stair 116c.

The stairs 116a-116c formed by embodiments of the disclosure also exhibit improved line width roughness (LWR) compared to stairs formed by conventional trim-etch-trim processes. Since the first liner material 118 and the second liner material 120 are formed at a high degree of conformality and a high degree of smoothness and the liners 118″, 120′ protect the sidewalls of the hardmask 114, the materials (e.g., the conductive levels 106 and the insulative levels 108 of the tiers 110) defining the stairs 116a-116c have a correspondingly improved LWR. The smooth sidewalls of the liners 118″, 120′ form the stairs 116a-116c having a corresponding degree of smoothness.

Figure 10B:
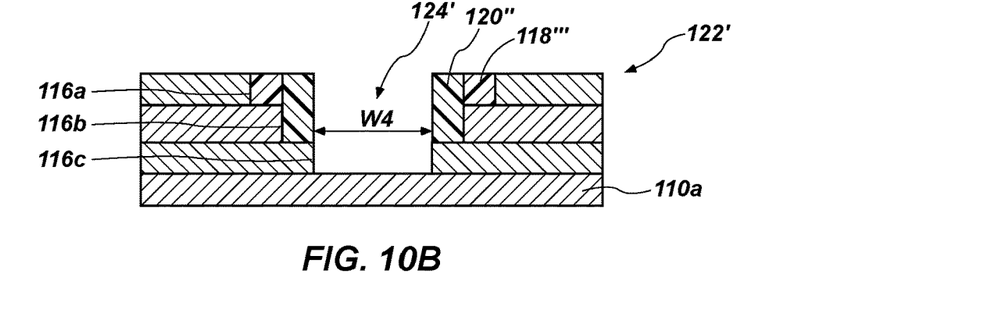

Alternatively, portions of the first liner 118‴ and the second liner 120″ may remain in the staircase structure 122′. The hardmask 114 and a portion of the first liner 118″ and the second liner 120′ may be removed, as shown in FIG. 10B, forming the staircase structure 122′ including the first liner 118‴ and the second liner 120″. The staircase structure 122′ may also include a gap 124′ (e.g., a valley), which is subsequently filled as described below. The presence of first liner 118‴ and the second liner 120″ may exhibit a negligible effect on performance of a semiconductor device containing the staircase structure 122′. Upper surfaces of the staircase structure 122′, the first liner 118‴, and the second liner 120″ may be substantially coplanar with one another. The gap 124′ has a substantially uniform width due to the remaining portions of the first liner 118‴ and the second liner 120″. As shown in FIG. 10B, the width of the gap 124′ is W4.

Figure 11A:
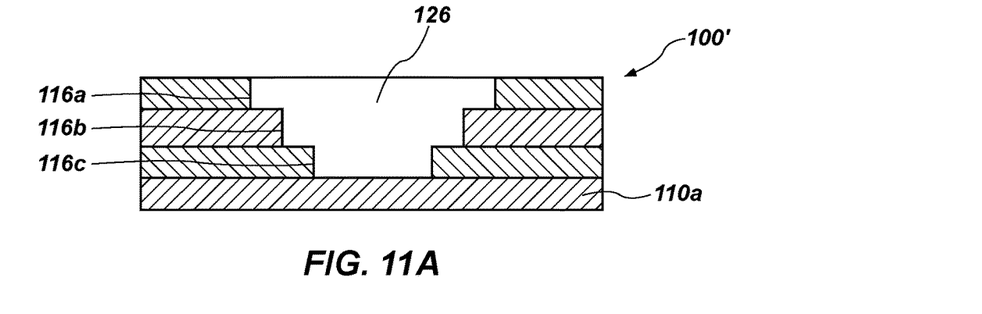
Figure 11B:
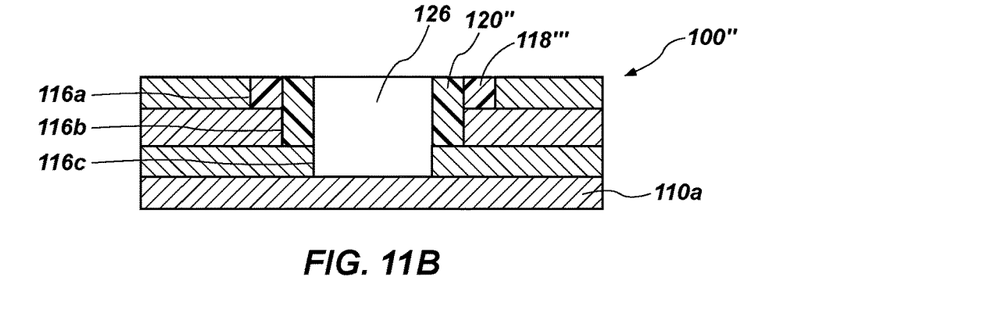

As shown in FIGS. 11A and 11B, the gap 124, 124′ is filled with a dielectric material 126 (e.g., an oxide material) by a so-called "gap-fill" process. The dielectric material 126 may be selected depending on the materials used as the liners 118′, 120′. In FIG. 11A, the gap 124 is filled with the dielectric material 126 and the dielectric material 126 is planarized, such as by a chemical-mechanical planarization (CMP) process, to form the semiconductor structure 100′ including the staircase structure 122.

In FIG. 11B, with the first liner 118‴ and the second liner 120″ partially filling the gap 124′, the dielectric material 126 may be used to fill the remainder of the gap 124′. The dielectric material 126 may be compatible with the materials of the first liner 118‴ and the second liner 120″. Therefore, the gap 124′, once filled, includes the at least three portions of materials: the first liner 118‴, the second liner 120″, and the dielectric material 126. Additional materials may be used to fill the gap 124′ if additional liners are formed. By way of example only, the gap 124′ may be filled with a silicon oxide material when the materials of the first liner 118‴ and the second liner 120″ are silicon oxide materials. The silicon oxide materials in the gap 124′ may be the same or may be different. After filling the gap 124′, the dielectric material may be planarized, such as by a chemical-mechanical planarization (CMP) process, to form the semiconductor structure 100″ including the staircase structure 122′. Since the gap 124′ includes the first liner 118‴ and the second liner 120″, a smaller volume of the dielectric material 126 is used to fill the gap 124′ compared to the volume used to fill the gap 124 in FIG. 11A or to fill a corresponding gap formed in the conventional trim-etch-trim processes. The large volume of the dielectric material 126 in the gap 124 may cause shrinkage, delamination, and stress within the dielectric material 126 during subsequent processing. However, due to the smaller volume used in the gap 124′, the shrinkage, delamination, and stress in the staircase structure 122′ are reduced compared to in the staircase structure 122 and in staircase structures formed by conventional trim-etch-trim processes. Therefore, the methods according to embodiments of the disclosure provide increased flexibility with filling the gap 124′.

Accordingly, a method of forming a staircase structure is disclosed. The method comprises forming a patterned hardmask over tiers. An exposed portion of an uppermost tier is removed to form an uppermost stair in the uppermost tier. A first liner material is conformally formed over the patterned hardmask and the uppermost tier, and a portion of the first liner material is removed to form a first liner on sidewalls of the patterned hardmask and the uppermost tier and to expose an underlying tier. An exposed portion of the underlying tier is removed to form an underlying stair in the underlying tier. A second liner material is conformally formed over the patterned hardmask, the first liner, and the second liner. A portion of the second liner material is removed to form a second liner on sidewalls of the first liner and the underlying tier and to expose another underlying tier. An exposed portion of the another underlying tier is removed to form another underlying stair in the another underlying tier. The patterned hardmask and at least a portion of the first liner and the second liner are removed.

Accordingly, another method of forming a staircase structure is disclosed. The method comprises forming a first liner laterally adjacent to a patterned hardmask and an uppermost tier, the uppermost tier comprising an uppermost stair. The first liner is used as a mask to form an underlying stair in an underlying tier. A second liner is formed laterally adjacent to the first liner and the underlying tier. The second liner is used as a mask to form another underlying stair in another underlying tier. The patterned hardmask and at least a portion of the first liner and the second liner are removed.

Accordingly, another method of forming a staircase structure is disclosed. The method comprises forming a patterned hardmask over tiers and forming a first liner material over the patterned hardmask. A portion of the first liner material is removed to form a first liner on sidewalls of the patterned hardmask and to expose an uppermost tier. An exposed portion of the uppermost tier is removed to form an uppermost stair in the uppermost tier and a second liner material is formed over the patterned hardmask, the first liner, and the uppermost tier. A portion of the second liner material is removed to form a second liner on sidewalls of the patterned hardmask, the first liner, and the uppermost tier and to expose an underlying tier. An exposed portion of the underlying tier is removed to form an underlying stair in the underlying tier. A third liner material is formed over the patterned hardmask, the first liner, the second liner, and the underlying tier and a portion of the third liner material is removed to form a third liner on sidewalls of the first liner and the underlying tier and to expose another underlying tier. An exposed portion of the another underlying tier is removed to form another underlying stair in the another underlying tier, and the patterned hardmask is removed.

Accordingly, a staircase structure is disclosed. The staircase structure comprises tiers, the tiers comprising a stepped profile. A fill material is between opposing sides of the tiers, the fill material comprising at least three portions.

Additional process acts for fabricating the staircase structures 122, 122' may be conducted by conventional techniques, which are not described in detail herein.

While the semiconductor structures 100', 100" in FIGS. 11A and 11B include three stairs 116a-116c, additional stairs 116 may be formed by repeating the formation (e.g., deposition) acts of additional liners 118', 120' and removal (e.g., etch) acts of exposed portions of tiers 110 in a similar manner as described above. The additional liners 118', 120' may have a depth within a range of from about 1 μm to about 15 μm, such as from about 2 μm to about 12 μm, from about 3 μm to about 11 μm, from about 5 μm to about 15 μm, or from about 1 μm to about 10 μm. The number of additional liners 118', 120' formed depends on the number of stairs 116 to be formed. The desired number of stairs 116 may be formed by repeating the formation (e.g., deposition) acts and removal (e.g., etch) acts the desired number of times. The number of stairs 116 formed may also be affected by the thickness of the hardmask 114, which should be formed at a sufficient thickness to survive the etch conditions used to form the desired number of stairs 116. By way of example only, from two stairs 116 to sixty-four stairs 116, such as from four stairs 116 to thirty-two stairs 116, from six stairs 116 to thirty-two stairs 116, from ten stairs 116 to thirty-two stairs 116, or from twelve stairs 116 to thirty-two stairs 116 may be formed by embodiments of the disclosure. Between two stairs 116 and twelve stairs 116 may be formed at a time. If more than twelve stairs 116 are to be formed, chops may be conducted by conventional techniques to form the additional stairs 116 in tiers 110 of a lower deck. Thus, the staircase structures 122, 122' may be formed by successive formation (e.g., deposition) acts of liners 118', 120' and removal (e.g., etch) acts of the tiers 110, where the liners 118', 120' are formed and portions of the tiers 110 removed using the liners 118', 120' as masks.

By conducting repeated formation (e.g., deposition) acts and removal (e.g., etch) acts, the staircase structures 122, 122' may be formed without needing to form a photoresist material at a large thickness over the tiers 110, as is required with conventional trim-etch-trim processes. Additionally, since the liners 118', 120' are formed by a highly controllable, conformal deposition technique, the width of the stairs 116 may be smaller than the width of stairs formed by conventional trim-etch-trim processes. The controllable process of forming the stairs 116 according to embodiments of the disclosure improves yield of semiconductor device structures including the staircase structures 122, 122' by reducing defects.

The stairs 116 define contact regions upon which contact structures (not shown) are positioned to provide electrical access to the conductive levels 106 of the tiers 110. At least one contact structure may be formed on each of the stairs 116 and coupled, such as electrically connected through a direct ohmic connection or through an indirect connection (e.g., via another structure electrically connected), to the conductive levels 106 of the tiers 110. The contact structures may be formed and coupled to the conductive levels 106 by conventional techniques, which are not described in detail herein. The contact structures may be coupled (e.g., attached, connected) to routing structures and at least one string driver device as known in the art.

In the staircase structure 122', portions of the first liner 118" and the second liner 120' may be removed (e.g., etched) to form contact holes (not shown) through the first liner 118" and the second liner 120'. The contact holes may be filled with a conductive material, forming the contact structures (not shown), which are coupled to the conductive levels 106 of the tiers 110. Since the conductive levels 106 of the tiers 110 are positioned at different depths, the first liner 118" and the second liner 120' have different lengths. The materials of the first liner 118" and the second liner 120' may be selected to be etchable at different rates using a single etch chemistry and etch conditions. By appropriately selecting the first liner material 118 and the second liner material 120, the contact holes may be formed through the first liner 118" and the second liner 120' substantially simultaneously. By way of example only, since the length of the first liner 118" is shorter than the length of the second liner 120', the material of the first liner 118" is selected to be etchable at a slower etch rate while the material of the second liner 120' is selected to be etchable at a faster etch rate. By appropriately selecting the materials of the first liner 118" and the second liner 120', the contact holes land on the conductive levels 106 of the tiers 110 at substantially the same time using the same etch chemistry and same etch conditions. For instance, a silicon oxide material may be used as the first liner 118" and the second liner 120', except having different concentrations of the dopant, providing the different etch selectivities. Alternatively, the materials of the first liner 118" and the second liner 120' may include different qualities of a silicon oxide material to provide the different etch selectivities. By forming the contact holes substantially simultaneously, no etch stop material is needed to land the contact holes on the conductive levels 106 at the desired level. The contact structures may be formed in the contact holes in the first liner 118″ and the second liner 120′.

The contact structures of the staircase structures 122, 122′ may electrically couple components (not shown) of the semiconductor device structure including the staircase structures 122, 122′ to each other. The components of the semiconductor device structure may include vertical strings of memory cells coupled to each other in series, data lines (e.g., bit lines), a source tier, access lines, first select gates (e.g., upper select gates, drain select gates (SGDs)), select lines, a second select gate (e.g., a lower select gate, a source select gate (SGS)), and additional contact structures. The vertical strings of memory cells extend vertically and orthogonal to conductive lines and tiers 110 and the contact structures may electrically couple the components to each other. For instance, the select lines may be coupled to the first select gates, and the access lines may be coupled to the tiers 110. The semiconductor device structure may also include a control unit, which may include one or more of string driver circuitry, pass gates, circuitry for selecting gates, circuitry for selecting conductive lines (e.g., the data lines, the access lines), circuitry for amplifying signals, and circuitry for sensing signals. The control unit may, for example, be electrically coupled to the data lines, source tier, access lines, first select gates, and second select gate, for example. The additional process acts to form the semiconductor device structure including the staircase structures 122, 122′ are not described in detail herein.

Figure 12:
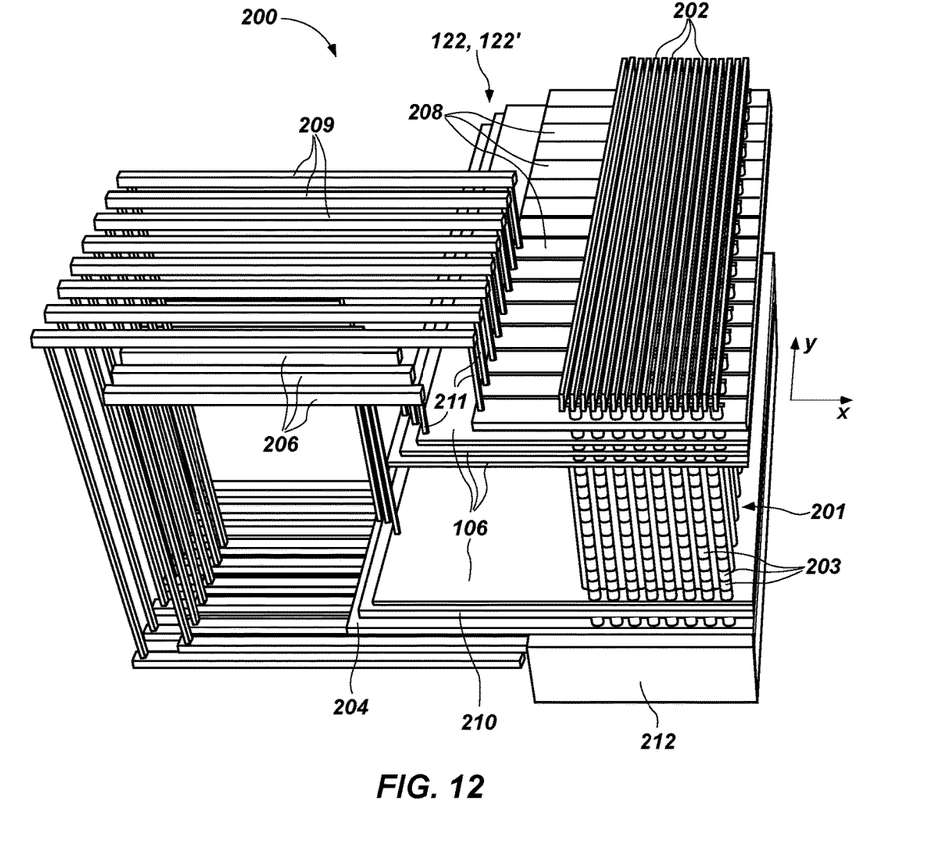
FIG. 12 is a partial cutaway perspective view of a semiconductor device structure including a staircase structure in accordance with embodiments of the disclosure.

FIG. 12 is a partial cutaway perspective view of a portion of a semiconductor device 200 (e.g., a vertical memory device, such as a 3D NAND Flash memory device), according to embodiments of the disclosure. The semiconductor device 200 includes a staircase structure 122, 122′ for defining contact regions for connecting access lines 206 to conductive levels 106 (e.g., conductive layers, conductive plates, etc.). The semiconductor device 200 may include vertical strings 201 of memory cells 203 that are coupled to each other in series. The vertical strings 201 may extend vertically and orthogonal to conductive levels 106 and tiers 110, such as data lines 202, a source tier 204, the conductive levels 106, the access lines 206, first select gates 208 (e.g., upper select gates, drain select gates (SGDs)), select lines 209, and a second select gate 210 (e.g., a lower select gate, a source select gate (SGS)).

Vertical conductive contacts 211 may electrically couple components to each other as shown. For example, the select lines 209 may be electrically coupled to the first select gates 208 and the access lines 206 may be electrically coupled to the conductive levels 106. The semiconductor device 200 may also include a control unit 212 positioned under the memory array, which may include at least one of string driver circuitry, pass gates, circuitry for selecting gates, circuitry for selecting conductive lines (e.g., the data lines 202, the access lines 206, etc.), circuitry for amplifying signals, and circuitry for sensing signals. The control unit 212 may be electrically coupled to the data lines 202, the source tier 204, the access lines 206, the first select gates 208, and the second select gates 210, for example.

The first select gates 208 may extend horizontally in a first direction x (e.g., to the left and right from the perspective of FIG. 10) and may be coupled to respective first groups of vertical strings 201 of memory cells 203 at a first end (e.g., an upper end) of the vertical strings 201. The second select gate 210 may be formed in a substantially planar configuration and may be coupled to the vertical strings 201 at a second, opposite end (e.g., a lower end) of the vertical strings 201 of memory cells 203.

The data lines 202 (e.g., bit lines) may extend horizontally in a second direction y (e.g., up and down from the perspective of FIG. 12) that is at an angle (e.g., perpendicular) to the first direction in which the first select gates 208 extend. The data lines 202 may be coupled to respective second groups of the vertical strings 201 at the first end (e.g., the upper end) of the vertical strings 201. A first group of vertical strings 201 coupled to a respective first select gate 208 may share a particular vertical string 201 with a second group of vertical strings 201 coupled to a respective data line 202. Thus, a particular vertical string 201 may be selected at an intersection of a particular first select gate 208 and a particular data line 202.

The conductive levels 106 (e.g., word line plates) may extend in respective horizontal planes. The conductive levels 106 may be stacked vertically, such that each conductive level 106 is coupled to all of the vertical strings 201 of memory cells 203, and the vertical strings 201 of the memory cells 203 extend vertically through the stack of conductive levels 106. The conductive levels 106 may be coupled to or may form control gates of the memory cells 203 to which the conductive levels 106 are coupled. Each conductive level 106 may be coupled to one memory cell 203 of a particular vertical string 201 of memory cells 203.

The first select gates 208 and the second select gates 210 may operate to select a particular vertical string 201 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive level 106 that are coupled to the particular memory cell 203.

The staircase structure 122, 122′ may be configured to provide electrical connection between the access lines 206 and the conductive levels 106 through the vertical conductive contacts 211. In other words, a particular level of the conductive level 106 may be selected via an access line 206 in electrical communication with a respective vertical conductive contact 211 in electrical communication with the particular conductive level 106.

Accordingly, a semiconductor device structure is disclosed. The semiconductor device structure comprises a stairstep structure comprising opposing tiers of alternating insulative levels and conductive levels or alternating insulative levels and nitride materials, the opposing tiers comprising a stepped profile. A fill material is in a valley between the opposing tiers and comprises at least three portions.

The formation (e.g., deposition) acts and removal (e.g., etch) acts may be conducted in a chamber of a single tool or in different tools. In some embodiments, the tool is configured to conformally form the first and second liner materials 118, 120, to remove portions of the liner materials to form the liners 118″, 120′, and to remove portions of the tiers 110 to form the stairs 116. The liner materials 118, 120, the liners 118″, 120′, and the stairs 116 are formed in situ in that the single tool may conduct both the deposition and etch acts in the same chamber. The tool may be configured to introduce the liner materials 118, 120 or precursor materials of the liner materials 118, 120, and to introduce etch chemistries used to remove portions of the liner materials 118, 120 and portions of the tiers 110. By conducting the formation (e.g., deposition) acts and the removal (e.g., etch) acts in a single tool chamber, the staircase structures 122, 122′ may be formed cheaper and faster than by conventional trim-etch-trim processes. Existing tools may be utilized to conduct the formation (e.g., deposition) acts and removal (e.g., etch) acts of embodiments of the disclosure. In other embodiments, one tool is configured to conformally form the liner materials 118, 120 and another tool is configured to form the liners 118", 120' and the stairs 116.

While the above embodiments describe and illustrate a 3D NAND Flash memory device formed by a floating gate process, embodiments of the disclosure may also be used to form a 3D NAND Flash memory device by a replacement gate process, where nitride materials are present instead of the conductive materials of the conductive levels 106. The semiconductor structure 100 in FIG. 1 may, therefore, include the nitride materials in place of the conductive levels 106. The nitride materials are subsequently replaced with the conductive material at a later stage of processing, in a so-called "replacement gate" process, to form the conductive levels 106. Details of the replacement gate process are known in the art and, therefore, are not described in detail herein. Thus, 3D floating gate NAND Flash memory devices or 3D replacement gate NAND Flash memory devices may be formed by embodiments of the disclosure.

Additional 3D semiconductor device structures including one or more staircase structures 122, 122', such as 3D DRAM devices or 3D crosspoint memory devices, may also be formed by embodiments of the disclosure. Embodiments of the disclosure may also be used to form other 3D semiconductor device structures where deep openings (e.g., high aspect ratio openings) of different depths are to be formed in a semiconductor structure having a stack of alternating conductive levels 106 and insulative levels 108. Low voltage semiconductor device structures may also be formed by embodiments of the disclosure. Additional process acts may be conducted to form the complete semiconductor device structure including the staircase structures 122, 122', which are not described in detail.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a staircase structure, comprising:
    forming a patterned hardmask over tiers;
    removing an exposed portion of an uppermost tier to form an uppermost stair in the uppermost tier;
    forming a first liner material over the patterned hardmask and the uppermost tier;
    removing a portion of the first liner material to form a first liner on sidewalls of the patterned hardmask and the uppermost tier and to expose an underlying tier;
    removing an exposed portion of the underlying tier to form an underlying stair in the underlying tier;
    forming a second liner material over the patterned hardmask, the first liner, and the underlying tier;
    removing a portion of the second liner material to form a second liner on sidewalls of the first liner and the underlying tier and to expose another underlying tier;
    removing an exposed portion of the another underlying tier to form another underlying stair in the another underlying tier; and
    removing the patterned hardmask.

2. The method of claim 1, wherein removing an exposed portion of an uppermost tier to form an uppermost stair comprises forming an opening in the uppermost tier, the opening comprising a widest opening dimension of the staircase structure.

3. The method of claim 1, wherein forming a first liner material over the patterned hardmask and the uppermost tier comprises forming the first liner material at a thickness corresponding to a tread width of the underlying stair.

4. The method of claim 1, wherein removing a portion of the first liner material to form a first liner comprises removing horizontal portions of the first liner material.

5. The method of claim 1, wherein removing an exposed portion of the underlying tier to form an underlying stair in the underlying tier comprises using the patterned hardmask and the first liner as a mask to form the underlying stair.

6. The method of claim 1, wherein forming a second liner material over the patterned hardmask, the first liner, and the underlying tier comprises forming the second liner material at a thickness corresponding to a tread width of the another underlying stair.

7. The method of claim 1, wherein removing a portion of the second liner material to form a second liner comprises removing horizontal portions of the second liner material.

8. The method of claim 1, wherein removing an exposed portion of the another underlying tier to form another underlying stair in the another underlying tier comprises using the patterned hardmask, the first liner, and the second liner as a mask to form the another underlying stair.

9. The method of claim 1, wherein removing the patterned hardmask comprises forming a gap between the tiers of alternating conductive levels and insulative levels.

10. The method of claim 9, further comprising filling the gap with a dielectric material.

11. The method of claim 9, wherein forming a gap between the tiers of alternating conductive levels and insulative levels comprises forming the gap comprising at least a portion of the first liner and the second liner.

12. The method of claim 11, further comprising substantially simultaneously forming contact holes through the first liner and the second liner.

13. The method of claim 1, wherein removing the patterned hardmask comprises removing the patterned hardmask and all of the first liner and the second liner.

14. The method of claim 1, further comprising forming contact structures on the uppermost stair, the underlying stair, and the another underlying stair of the staircase structure.

15. The method of claim 1, wherein forming a first liner material, removing a portion of the first liner material to form a first liner, removing an exposed portion of the underlying tier, forming a second liner material, removing a portion of the second liner material, and removing an exposed portion of the another underlying tier comprises conducting the acts in a single tool.

16. The method of claim 1, wherein forming a first liner material over the patterned hardmask and the uppermost tier and forming a second liner material over the patterned hardmask comprises conformally forming the first liner material and the second liner material.

17. The method of claim 1, wherein removing the patterned hardmask comprises removing the patterned hardmask and at least a portion of the first liner and the second liner.

18. The method of claim 1, wherein forming a patterned hardmask over tiers comprises forming the patterned hardmask over tiers of alternating conductive levels and insulative levels.

19. The method of claim 1, wherein forming a patterned hardmask over tiers comprises forming the patterned hardmask over tiers of alternating nitride materials and insulative levels.

20. A method of forming a staircase structure, comprising:
forming a first liner laterally adjacent to a patterned hardmask and an uppermost tier, the uppermost tier comprising an uppermost stair;
using the first liner as a mask to form an underlying stair in an underlying tier;
forming a second liner laterally adjacent to the first liner and the underlying tier;
using the second liner as a mask to form another underlying stair in another underlying tier; and
removing the patterned hardmask and at least a portion of the first liner and the second liner.

21. The method of claim 20, wherein forming a first liner and forming a second liner comprises forming the first liner and the second liner from a material independently selected from the group consisting of a silicon oxide, a silicon nitride, and a metal oxide.

22. The method of claim 20, wherein forming a first liner and forming a second liner comprises forming the first liner and the second liner from the same material.

23. The method of claim 20, wherein forming a first liner and forming a second liner comprises forming the first liner and the second liner from different materials.

24. The method of claim 23, wherein forming a first liner and forming a second liner comprises selecting materials of the first liner and the second liner formulated to exhibit different etch rates.

25. The method of claim 24, further comprising substantially simultaneously forming contact holes through the first liner and the second liner.

26. The method of claim 20, wherein using the first liner as a mask to form an underlying stair comprises forming the underlying stair having a tread width corresponding to a width of the first liner.

27. The method of claim 20, wherein using the second liner as a mask to form another underlying stair comprises forming the another underlying stair having a tread width corresponding to a width of the second liner.

28. A method of forming a staircase structure, comprising:
forming a patterned hardmask over tiers;
forming a first liner material over the patterned hardmask;
removing a portion of the first liner material to form a first liner on sidewalls of the patterned hardmask and to expose an uppermost tier;
removing an exposed portion of the uppermost tier to form an uppermost stair in the uppermost tier;
forming a second liner material over the patterned hardmask, the first liner, and the uppermost tier;
removing a portion of the second liner material to form a second liner on the sidewalls of the patterned hardmask, the first liner, and the uppermost tier and to expose an underlying tier;
removing an exposed portion of the underlying tier to form an underlying stair in the underlying tier;
forming a third liner material over the patterned hardmask, the first liner, the second liner, and the underlying tier;
removing a portion of the third liner material to form a third liner on sidewalls of the first liner and the underlying tier and to expose another underlying tier;
removing an exposed portion of the another underlying tier to form another underlying stair in the another underlying tier; and
removing the patterned hardmask.

\* \* \* \* \*

UNITED STATES PATENT AND TRADEMARK OFFICE
CERTIFICATE OF CORRECTION

PATENT NO. : 10,147,638 B1
APPLICATION NO. : 15/858072
DATED : December 4, 2018
INVENTOR(S) : Lance Williamson et al.

Page 1 of 1

It is certified that error appears in the above-identified patent and that said Letters Patent is hereby corrected as shown below:

In the Specification

Column 10,   Line 45,    change "the thickness W3 of" to --the thickness of--
Column 11,   Line 19,    change "stairs 116*b* , 116*c*" to --stairs 116*b*, 116*c*--

Signed and Sealed this
Fifth Day of February, 2019

Andrei Iancu
*Director of the United States Patent and Trademark Office*